US012791263B2

(12) United States Patent
Alahyari et al.

(10) Patent No.: US 12,791,263 B2
(45) Date of Patent: Nov. 10, 2026

(54) OSCILLATING HEAT PIPES OPERABLE WITHIN HIGH GRAVITY FORCE EQUIVALENT (G-FORCE) ENVIRONMENTS

(71) Applicant: Raytheon Company, Waltham, MA (US)

(72) Inventors: Abbas A. Alahyari, Glastonbury, CT (US); Miad Yazdani, South Windsor, CT (US)

(73) Assignee: RAYTHEON COMPANY, Waltham, MA (US)

( * ) Notice: Subject to any disclaimer, the term of this patent is extended or adjusted under 35 U.S.C. 154(b) by 151 days.

(21) Appl. No.: 17/871,836

(22) Filed: Jul. 22, 2022

(65) Prior Publication Data

US 2024/0027139 A1 Jan. 25, 2024

(51) Int. Cl.

| | |
|---|---|
| ***F28D 15/04*** | (2006.01) |
| ***F28D 15/02*** | (2006.01) |
| ***H05K 7/20*** | (2006.01) |

(52) U.S. Cl.

CPC ....... *F28D 15/043* (2013.01); *F28D 15/0208* (2013.01); *F28D 15/0233* (2013.01); *H05K 7/20336* (2013.01)

(58) Field of Classification Search

CPC ............................ F28D 15/02; F28D 15/0266

See application file for complete search history.

(56) References Cited

U.S. PATENT DOCUMENTS

| | | | |
|---|---|---|---|
| 8,919,426 | B2 | 12/2014 | Hardesty |
| 10,264,707 | B2 | 4/2019 | Kim et al. |

(Continued)

FOREIGN PATENT DOCUMENTS

| | | | |
|---|---|---|---|
| CN | 107466195 A | * 12/2017 | |
| CN | 112857113 A | 5/2021 | |

(Continued)

OTHER PUBLICATIONS

Delil, Pulsating & Oscillating Heat Transfer Devices in Acceleration Environments from Microgravity to Supergravity, http://www.jstor.org/stable/44687200, Jun. 29, 2001, 18 pages, SAE Transactions, Warrendale, PA.

(Continued)

*Primary Examiner* — Eric S Ruppert

(74) *Attorney, Agent, or Firm* — CANTOR COLBURN LLP

(57) ABSTRACT

An oscillating heat pipe that can maintain efficient heat transfer even in a high gravity force equivalent environment is provided. The heat pipe can comprise a condenser region having a first plurality of bends, an evaporator region having a second plurality of bends, and a plurality of intermediate portions. The plurality of intermediate portions can extend between the first plurality of bends and the second plurality of bends. The plurality of intermediate portions can include a first intermediate portion and a second intermediate portion. A cross-sectional area of the first intermediate portion can be larger than a cross-sectional area of the second intermediate portion in a plane at a first distance from the evaporator region. The cross-sectional area of at least one of the first or second intermediate portions can increase from the condenser region towards the evaporator region.

8 Claims, 4 Drawing Sheets

(56) References Cited

U.S. PATENT DOCUMENTS

| | | | |
|---|---|---|---|
| 2021/0213571 A1 | 7/2021 | Alahyari et al. | |
| 2021/0254899 A1 | 8/2021 | Alahyari et al. | |
| 2026/0287272 A1 | 9/2026 | Alahyari et al. | |

FOREIGN PATENT DOCUMENTS

| | | | | |
|---|---|---|---|---|
| CN | 113587694 A | | 11/2021 | |
| CN | 114184068 A | | 3/2022 | |
| CN | 216592921 U | | 5/2022 | |
| EP | 3246648 B1 | | 8/2019 | |
| WO | WO-2011149216 A2 | * | 12/2011 | ......... F28D 15/0233 |

OTHER PUBLICATIONS

Delil, Oscillating/Pulsating Heat Transfer & Thermal Control Devices (In Acceleration Environments Ranging from Micro- to Supergravity), 2003, 26 pages, consultants on Advanced Aerospace Thermal Control Systems.

Hathaway, An investigation into gravity independent oscillating heat pipes, https://mospace.umsystem.edu/xmlui/handle/10355/43168, 2012, 2 pages, University of Missouri, Columbia, Missouri.

Jang et al., Flow patterns and heat transfer characteristics of flat plate pulsating heat pipes with various asymmetric and aspect ratios of the channels, Applied Thermal Engineering, 2017, pp. 211-220, vol. 114, Elsevier, Netherlands.

Mameli et al., Pulsating Heat Pipe in Hypergravity Conditions, Heat Pipe Science and Technology: An International Journal, 2015, vol. 6, Issue 1-2, pp. 91-109, Begell House, Inc., Danbury, Connecticut.

* cited by examiner

OSCILLATING HEAT PIPES OPERABLE WITHIN HIGH GRAVITY FORCE EQUIVALENT (G-FORCE) ENVIRONMENTS

BACKGROUND

Oscillating Heat Pipes are typically formed of looping portions or channels and include a condenser region and an evaporator region that are interconnected by an adiabatic region. The looping channels can be filled with a two-phase fluid mixture (i.e., a working fluid), which acts as a heat transfer medium for the system. Instabilities caused by the intermittent evaporation and condensation of the working fluid causes the working fluid to move from the evaporator region to condenser region and to return from the condenser region back to the evaporator region in order to transfer heat between the evaporator and condenser regions.

In some applications, high gravity loads (i.e., gravitational forces in excess of the normal force of gravity) in high gravity force environments can deteriorate the performance of an oscillating heat pipe by preventing the working fluid from returning to the condenser region from the evaporator region. In an example of airborne vehicles, this can be detrimental to critical equipment that relies on an oscillating heat pipe for cooling. Thus, there is a need for improvements in oscillating heat pipes such that an oscillating heat pipe is less sensitive to high gravity loads and can rapidly resume normal operation once a high gravity load is reduced or removed.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
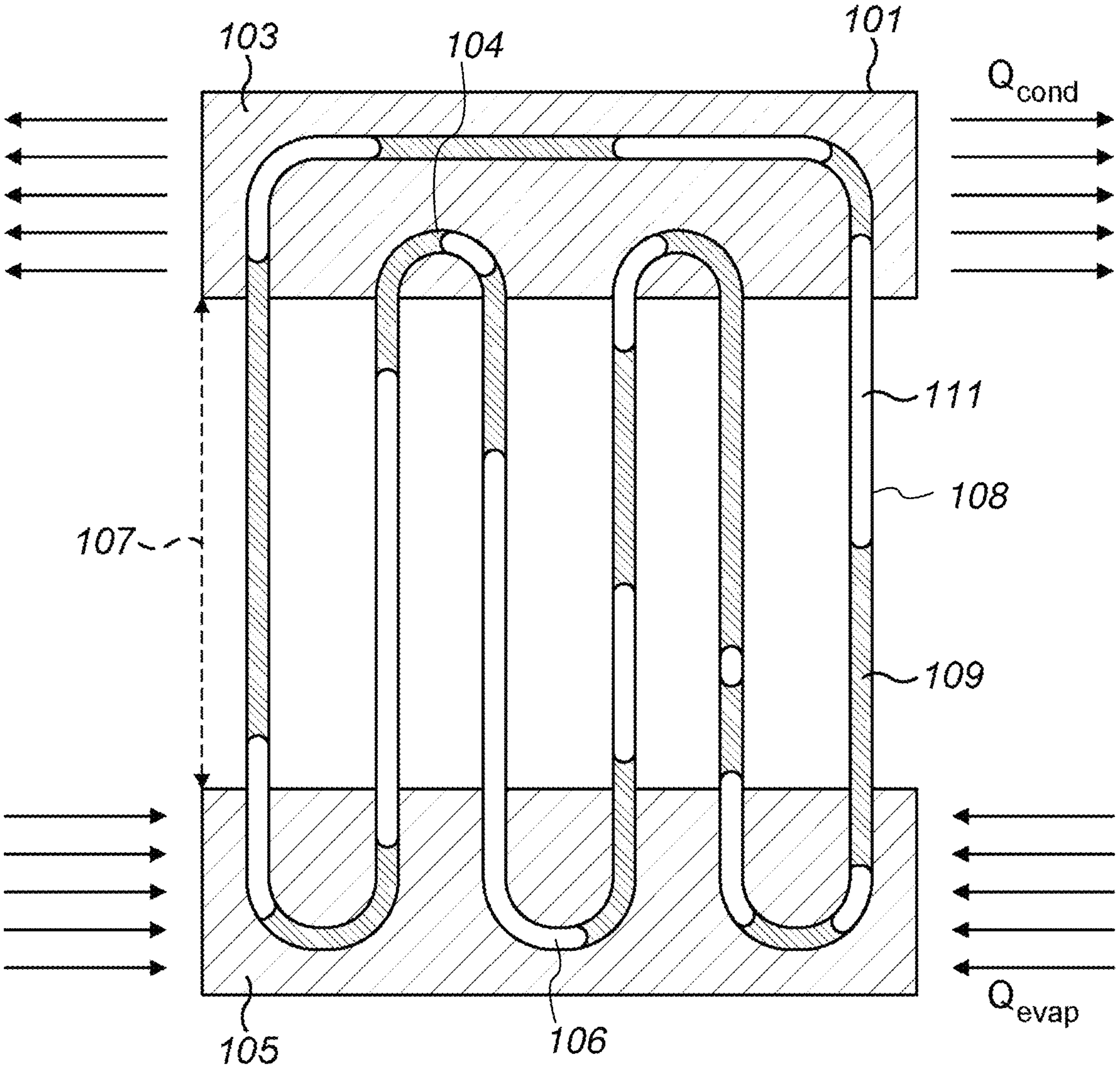
FIG. 1 is a schematic view of an oscillating heat pipe.

Reference will now be made to the exemplary embodiments illustrated, and specific language will be used herein to describe the same. It will nevertheless be understood that no limitation of the scope of the disclosure is thereby intended.

DETAILED DESCRIPTION

An initial overview of the disclosure is provided below and then specific examples are described in further detail later. This initial summary is intended to aid readers in understanding the examples more quickly, but is not intended to identify key features or essential features of the examples, nor is it intended to limit the scope of the claimed subject matter.

According to one example of the present disclosure, an oscillating heat pipe that can maintain efficient heat transfer even in a high gravity force equivalent environment is provided. The heat pipe can comprise a condenser region having a first plurality of bends, an evaporator region having a second plurality of bends, and a plurality of intermediate portions extending between the first plurality of bends and the second plurality of bends. The plurality of intermediate portions can include a first intermediate portion and a second intermediate portion. A cross-sectional area of the first intermediate portion can be larger than a cross-sectional area of the second intermediate portion in a plane at a first distance from the evaporator region. The cross-sectional area of at least one of the first or second intermediate portions can increase from the condenser region towards the evaporator region.

In another example, the plurality of intermediate portions can comprise a plurality of the first intermediate portions and a plurality of the second intermediate portions. The plurality of intermediate portions can alternate between the first intermediate portion and the second intermediate portion.

In some examples, the cross-sectional area of the first intermediate portion can be 1.5 times to 5 times larger than the cross-sectional area of the second intermediate portion in the plane at the first distance from the evaporator region. In some examples, the cross-sectional area of the first intermediate portion can be three times larger than the cross-sectional area of the second intermediate portion in the plane at the first distance from the evaporator region.

In some examples, the cross-sectional area of both the first and second intermediate portions increases from the condenser region towards the evaporator region. The cross-sectional area of the at least one of the first or second intermediate portions can increase by 1.5 times to 10 times from the condenser region to the evaporator region. In some examples, the cross-sectional area of the at least one of the first or second intermediate portions can increase by 4 times from the condenser region to the evaporator region.

In some examples, the cross-sectional area of the at least one of the first or second intermediate portions increases linearly from the condenser region to the evaporator region. In some examples, the cross-sectional area of the at least one of the first or second intermediate portions increases non-linearly from the condenser region to the evaporator region. In some examples, the cross-sectional area of the at least one of the first or second intermediate portions increases in a stepwise manner from the condenser region to the evaporator region.

In one example, the condenser region can comprise a first condenser region and a second condenser region. The plurality of intermediate portions can connect the evaporator region to the first condenser region, and can connect the evaporator region to the second condenser region. In some examples, the plurality of intermediate portions form at least part of an adiabatic region extending between the evaporator region and the condenser region.

In another example, an oscillating heat pipe can comprise a condenser region comprising a first plurality of bends, an evaporator region comprising a second plurality of bends, and a plurality of intermediate portions connecting the first plurality of bends to the second plurality of bends. The plurality of intermediate portions can comprise first intermediate portions and second intermediate portions. Cross-sectional areas of the first intermediate portions can be larger than cross-sectional areas of the second intermediate portions in a plane at a first distance from the evaporator region. The plurality of intermediate portions in the adiabatic region can alternate between the first intermediate portions and the second intermediate portions. The cross-sectional areas of the first and second intermediate portions can increase from the condenser region towards the evaporator region.

In another example, an oscillating heat pipe can comprise a first condenser region comprising a first plurality of bends, a second condenser region comprising a second plurality of bends, an evaporator region comprising a third plurality of bends and a fourth plurality of bends, and a plurality of intermediate portions. The plurality of intermediate portions can connect the first plurality of bends of the first condenser region to the third plurality of bends of the evaporator region and can connect the second plurality of bends of the second condenser region to the fourth plurality of bends of the evaporator region.

The plurality of intermediate portions can comprise first intermediate portions and second intermediate portions Cross-sectional areas of the first intermediate portions can be larger than cross-sectional areas of the second intermediate portions in planes at a first distance from the evaporator region. The plurality of intermediate portions can alternate between the first intermediate portions and the second intermediate portions. Cross-sectional areas of the first and second intermediate portions can increase from the first and second condenser regions, respectively, towards the evaporator region.

A more thorough description will now be provided with reference to the accompanying figures. The details shown in the figures are not necessarily to scale, but are shown to aid in understanding the features of the subject technology. FIG. 1 schematically shows an oscillating heat pipe 101. The oscillating heat pipe 101 can comprise a condenser region 103, an evaporator region 105 and an adiabatic region 107.

The evaporator region 105 can comprise a plurality of bends 106 in the oscillating heat pipe 101 that are operable to absorb heat from a heat source into a working fluid contained within the oscillating heat pipe 101. The evaporator region 105 can also include any structure or device that transfers heat from the heat source into the working fluid within the plurality of bends 106 of the oscillating heat pipe 101. Thus, the evaporator region 105 can be thermally coupled to a heat source. The heat source can be an electronic component or other device that generates unwanted heat, such as a battery, processing unit, and/or other components or devices as will be apparent to those skilled in the art.

The condenser region 103 can comprise a plurality of bends 104 in the oscillating heat pipe 101 that are operable to transfer heat out of the working fluid within the oscillating heat pipe 101. The condenser region 103 can be thermally coupled to a heat sink that can comprise any suitable type of structure or device for transferring heat out of the working fluid.

As with the example shown, the oscillating heat pipe 101 can be configured in a meandering or serpentine configuration comprising the pluralities of bends 104, 106 and a plurality of intermediate portions 108 extending from and connecting the pluralities of bends 104, 106. A first plurality of bends 106 can be located in the evaporator region 105 and a second plurality of bends 104 can be located in the condenser region 103. The example meandering or serpentine configuration shown in FIG. 1 comprises bends 104 and bends 106 that alternate as shown. This alternating configuration is beneficial in that the working fluid within the oscillating heat pipe 101 is alternately heated in the evaporator region 105 and cooled in the condenser region 103 of the oscillating heat pipe 101.

In the example shown in FIG. 1 the oscillating heat pipe 101 forms a closed loop. However, other configurations can be implemented such as an oscillating heat pipe having an inlet and an outlet disposed, for example, in the condenser region 103.

The oscillating heat pipe 101 can have a diameter that is small enough to enable liquid slugs 109 and vapor plugs 111 to be formed within the working fluid. The diameter of the oscillating heat pipe 101 that enables the formation of liquid slugs 109 and vapor plugs 111 can depend upon the type of working fluid that is used, as well as the makeup and associated properties of the working fluid and the oscillating heat pipe 101 that contribute to things such as surface tension, liquid density, vapor density or any other suitable property.

In the example shown in FIG. 1, an adiabatic region 107 is provided between the evaporator region 105 and the condenser region 103. The adiabatic region 107 comprises a plurality of intermediate portions 108 of the oscillating heat pipe 101 that extend between the bends 104 in the condenser region 103 and the bends 106 in the evaporator region 105. It is noted that while intermediate portions 108 the adiabatic region 107 shown in FIG. 1 comprise a plurality of straight portions, this is not intended to be limiting. The intermediate portions 108 of the oscillating heat pipe 101 in the adiabatic region 107 need not be straight and can take on any geometry to conform to any arbitrary surface based on a desired application and implementation. For example, the adiabatic region 107 can be saddle shaped with each of the intermediate portions 108 of the oscillating heat pipe 101 in the adiabatic region 107 conforming to the saddle shape. The adiabatic region 107 can move the working fluid, such that heat obtained from the evaporator region 105 is moved through the oscillating heat pipe 101 until the working fluid reaches the condenser region 103 where the heat can be drawn from the working fluid and transferred out of the oscillating heat pipe 101.

It is noted that the adiabatic region 107 can be any size relative to the condenser region 103 and the evaporator region 105. For example, the adiabatic region 107 can be relatively long compared to the condenser region 103 and the evaporator region 105. In other embodiments, the adiabatic region 107 can essentially be omitted and the oscillating heat pipe 101 can alternately extend directly from the condenser region 103 to the evaporator region 104. In this example, the intermediate portions 108 of the oscillating heat pipe 101 extending between the bends 104, 106 can be a part of the condenser region 103, the evaporator region 105, or both. In some examples, the condenser region 103 and the evaporation region 105 can overlap.

When the oscillating heat pipe 101 is in use, heat can be applied to the working fluid in the bends 106 within the evaporator region 105. This heat can cause at least some of the working fluid to evaporate. This evaporation results in an increase of vapor pressure inside the oscillating heat pipe 101, which causes the generation and growth of bubbles within the evaporator region 105. The growth of the bubbles and the increase in vapor pressure forces liquid slugs 109 of the working fluid towards the condenser region 103. The working fluid that is pushed to the condenser region 103 is then cooled by the condenser. This cooling reduces the vapor pressure within the working fluid and causes condensation of the bubbles and provides a restoring force that pushes the working fluid back towards the evaporator region 105. This process of alternate increased vapor pressure leading to bubble generation/growth and subsequent condensation causes oscillation of the working fluid within the oscillating heat pipe 101 and allows for the transfer of heat between the evaporator region 105 and the condenser region 103.

The oscillating heat pipe 101 can be configured so that it can function in any orientation. That is, the movement of the fluid within the oscillating heat pipe 101 need not be dependent upon gravity. This makes the oscillating heat pipe 101 suitable for use in a variety of applications in which the oscillating heat pipe can be used in different orientations. The oscillating heat pipe 101 can be formed from a variety of different suitable materials based on the intended application including metals, polymers, or the like, or a combination of these.

Figure 2:
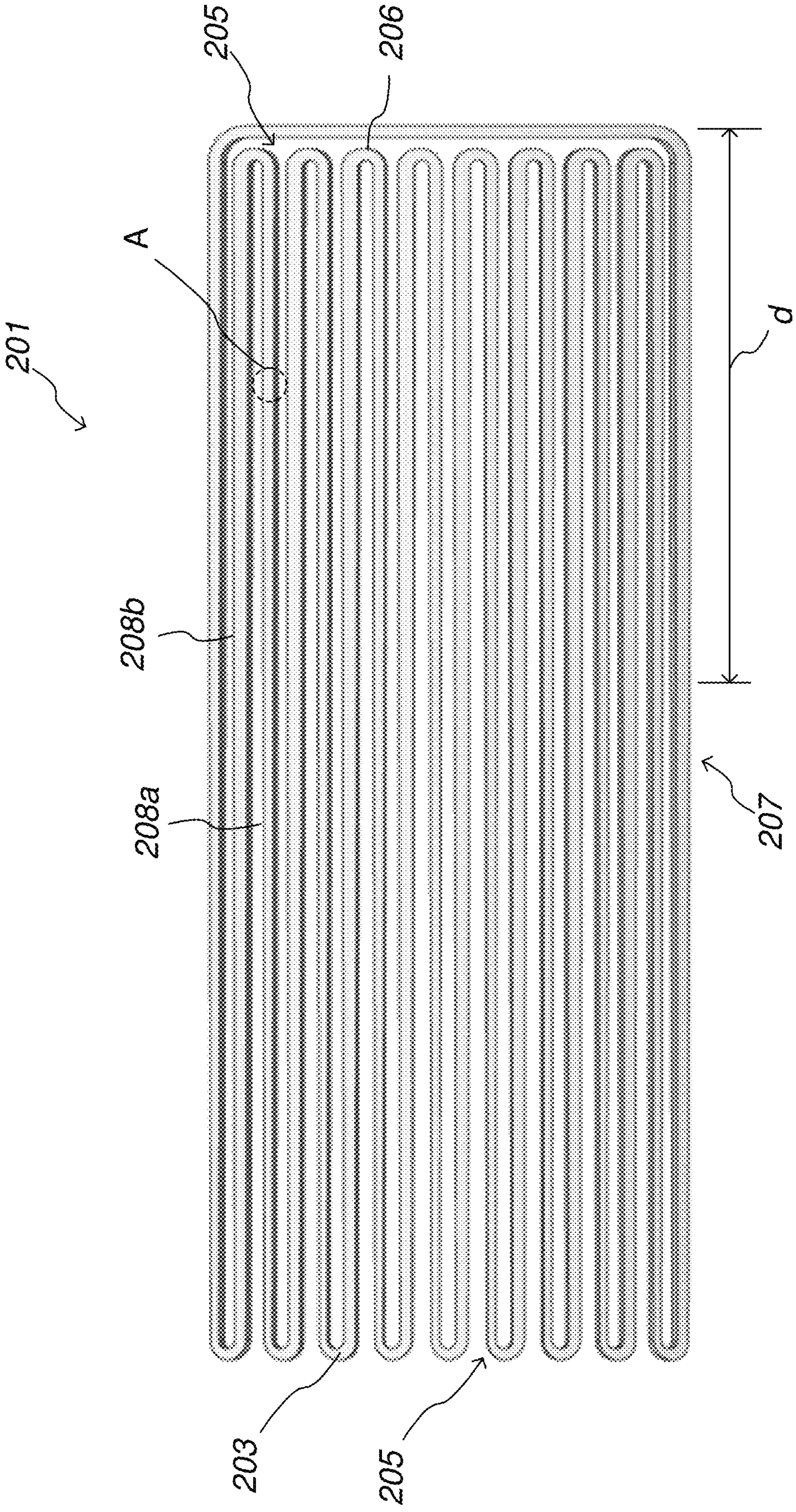
FIG. 2 is a partial schematic view of an oscillating heat pipe with portions having different cross-sectional areas in accordance with an example of the present disclosure.

As mentioned above, high gravity loads (i.e., gravitational forces in excess of the normal force of gravity) in high gravity force environments can deteriorate the performance of an oscillating heat pipe by preventing the working fluid from returning to the condenser region from the evaporator region. In an example of airborne vehicles, which are subject to different magnitudes of gravitational forces above the normal gravitational force during flight, this can be detrimental to critical equipment that rely on an oscillating heat pipe for cooling. Accordingly, FIG. 2 shows a partial schematic view of an oscillating heat pipe 201 with portions of the oscillating heat pipe 201 having different cross-sectional areas. These different cross-sectional areas of the heat pipe 201 have been found to increase the performance of the heat pipe 201 subject to high gravity loads.

As shown in FIG. 2, an oscillating heat pipe 201 (shown as a single pipe with various bends and intermediate portions) that can maintain its intended operational function and performance under high gravity loads can comprise an evaporator region 205 having a plurality of bends 206. The oscillating heat pipe 201 can also comprise a condenser region 203 having a plurality of bends 204.

The oscillating heat pipe 201 can further comprise an adiabatic region 207 that includes a plurality of intermediate portions, each of which extend between each of the various bends 204, 206, including a first intermediate portion 208*a* and a second intermediate portion 208*b*. It is noted that while intermediate portions of the adiabatic region 207 are shown to schematically include straight portions, the adiabatic region 207 can conform to any desired geometry, such that the intermediate portions take on any desired geometry to conform to an arbitrary surface based on a given application or implementation. Further, the adiabatic region 207 can be omitted (i.e. the evaporator region 205 and condenser region 203 can be adjacent or overlap). In this instance, the intermediate portions of the oscillating heat pipe 201 between the each of the various bends 204, 206 are part of one of the evaporator region 205, the condenser region 203, or both.

The first and second intermediate portions 208*a* and 208*b* (i.e. intermediate portions) can be configured to have different cross-sectional areas at a given distance from the evaporator region 205. For example, a cross sectional area of the oscillating heat pipe 201 in the first intermediate portion 208*a* is larger than a cross sectional area of the oscillating heat pipe 201 in the second intermediate portion 208*b* as measured or taken at a location of a plane at a given distance d from the evaporator region 205. The adiabatic region 207 can further comprise a plurality of first intermediate portions 208*a* and a plurality of second intermediate portions 208*b*.

As shown in FIG. 2, the adiabatic region 207 can comprise alternating first and second intermediate portions 208*a*, 208*b*. In this example, at a location along a plane at a given distance d from the evaporator region 205, the adiabatic region 207 would comprise alternating intermediate portions 208*a*, 208*b* that effectively provide for alternating larger cross-sectional areas to small cross-sectional areas. However, other variations are also possible. For example, the oscillating heat pipe 201 could comprise a pattern of two intermediate portions 208*a* having the same cross-sectional areas and then two intermediate portions 208*b* having the same cross-sectional areas. In another example, the oscillating heat pipe 201 could comprise a pattern of three intermediate portions having the same cross-sectional areas 208*a* then three intermediate portions 208*b* having the same cross-sectional areas. There could further be a pattern of one intermediate portion 208*a* and two, three, four or any number of intermediate portions 208*b*. In other words, the intermediate portions 208*a*, 208*b* can be arranged in the adiabatic region 205 in any desired configuration.

In some examples, the first intermediate portion 208*a* can have a cross sectional area at a distance d from the evaporator region 205 that is about three times larger than a cross-sectional area of the second intermediate portion 208*b* at a distance d from the evaporator region 205. In some examples, the first intermediate portion 208*a* can have a cross-sectional area at a distance d from the evaporator region 205 that is between about 1.1 to 5 times larger than a cross-sectional area of the second intermediate portion 208*b*. In other examples, the first intermediate portion 208*a* can have a cross-sectional area at a distance d from the evaporator region 205 that is between about 1.1 to 1.5, 1.1 to 2, 2-3, 3-4, or 4-5 times larger than a cross-sectional area of the second intermediate portion 208*b*.

To further increase the performance of the oscillating heat pipe 201, the first intermediate portion 208*a*, the second intermediate portion 208*b*, or each of the first and second intermediate portions 208*a*, 208*b* (including the plurality of these, as discussed above) can be configured to have a cross-sectional area that changes over their respective lengths (i.e., a non-uniform cross-sectional area or taper along the length of the first and/or second intermediate portions 208*a* and/or 208*b*), which in one example, the length can be measured to be between the condenser region (see, e.g., condenser region 103 in FIG. 1) and the evaporator region 205. In this example, the cross-sectional area of at least one of the first or second intermediate portions 208*a*, 208*b* (i.e., any one or a combination of these) can increase from the condenser region to the evaporator region 205.

Figure 3A:
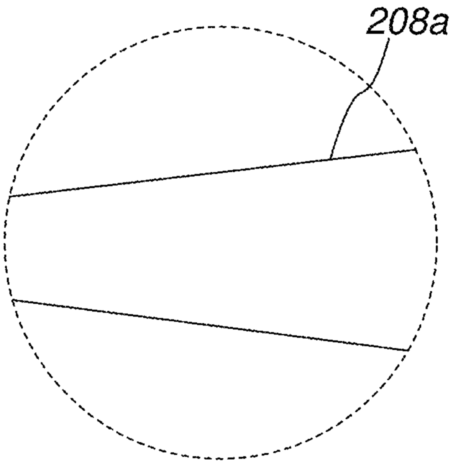
FIGS. 3A, 3B, and 3C are schematic views of different example cross-sectional areas over a portion of the oscillating heat pipe of FIG. 2.
Figure 3B:
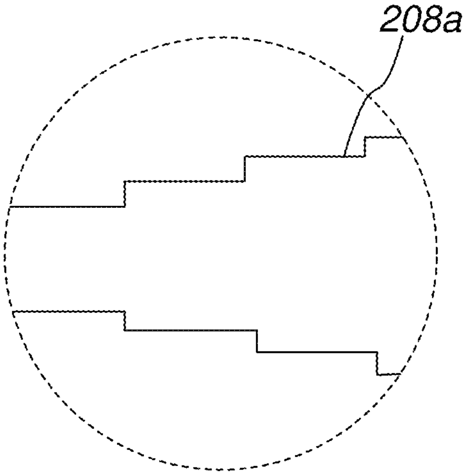
Figure 3C:
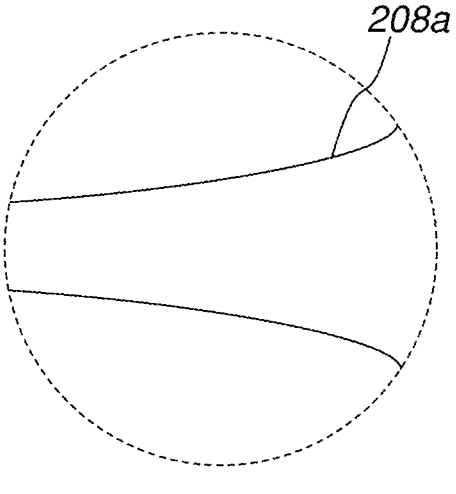

FIGS. 3A-3C show schematic examples of different possible configurations of the exemplary intermediate portion 208*a* to achieve a non-uniform cross-sectional area or taper along the length of the exemplary intermediate portion 208*a*. FIGS. 3A-3C illustrate only a portion of the exemplary intermediate portion 208*a* as designated by circle A in FIG. 2. The different configurations or geometries illustrated in FIGS. 3A-3C to achieve the taper of the intermediate portion 208*a* are not necessarily to scale, but may be exaggerated to facilitate understanding. As shown in FIG. 3A, the intermediate portions 208*a* (which can be the intermediate portion 208*a* or 208*b* shown in FIG. 2) can comprise a linear taper. That is, the rate of change in the increasing cross-sectional area of the intermediate portion 208*a* can be consistent from the condenser region toward the evaporator region.

As shown in FIG. 3B, the cross-sectional area of the intermediate portion 208*a* can be configured to increase from the condenser region towards the evaporator region in a stepwise manner with the intermediate portion 208*a* comprising one or more steps or step-ups (e.g., a sudden increase in diameter of the intermediate portion 208*a*). That is, the cross-sectional area can remain constant over part of the intermediate portion 308*b*, and then can increase over another part of the intermediate portion 308*b* via a step-up, thus producing a varying rate of change (i.e., a stepwise rate of change) of the cross-sectional area over the length of the intermediate portion 208*a*. The number and size of the individual step-ups can be tuned to meet the performance specifications and requirements of a particular application, and thus those specifically shown in FIG. 3B are not intended to be limiting in any way.

As shown in FIG. 3C, the cross-sectional area of the intermediate portion 208*a* can increase in a non-linear manner from the condenser region towards the evaporator region. In this example, the cross-sectional area of the intermediate portion 208*a* can have a rate of increase that varies over the length of the intermediate portion 208*a*.

In these examples, the non-uniform cross-sectional area of the intermediate portion 208*a* increases from the condenser region towards the evaporator region. However, it is to be understood that the non-uniform cross-sectional area of a intermediate portion of an oscillating heat pipe configured in accordance with the technology discussed herein can alternatively decrease from the condenser region towards the evaporator region.

It is noted that the cross-sectional area of the intermediate portion 208*a* can change in a variety of ways. For example, if the cross-sectional area is circular, a diameter of the circular cross-sectional area can change from the condenser region toward the evaporator region. If the cross-sectional area is rectangular, the cross-sectional area can change by changing just one of the width or the length of the rectangular cross-section, or by changing both the width and the length of the cross-sectional area. In other examples, the geometry of the non-uniform cross-sectional area can change as it increases/decreases from the condenser region toward the evaporator region. For example, the cross-sectional area can resemble a circle towards the condenser region, but can change to resemble an elongated ellipse as it approaches the evaporator region.

As mentioned above, and returning to FIG. 2, each of the plurality of intermediate portions 208*a*, 208*b* can have a cross-sectional area that increases from the condenser region towards the evaporator region. However, in some examples, only the first intermediate portion(s) 208*a* can have a cross-sectional area that increases from the condenser region towards the evaporator region while the cross-sectional area(s) of the second intermediate portion(s) 208*b* can remain constant from the condenser region to the evaporator region. In other examples, the second intermediate portion (s) 208*b* can have a cross-sectional area that increases from the condenser region towards the evaporator region while the cross-sectional area(s) of the first intermediate portion(s) 208*a* can remain constant from the condenser region to the evaporator region.

In some examples, at least one the intermediate portions 208*a* or 208*b* can have a cross-sectional area that increases by about four times from the condenser region to the evaporator region. In some examples, the cross-sectional area can increase by 1.5 times to ten times from the condenser region to the evaporator region.

Figure 4:
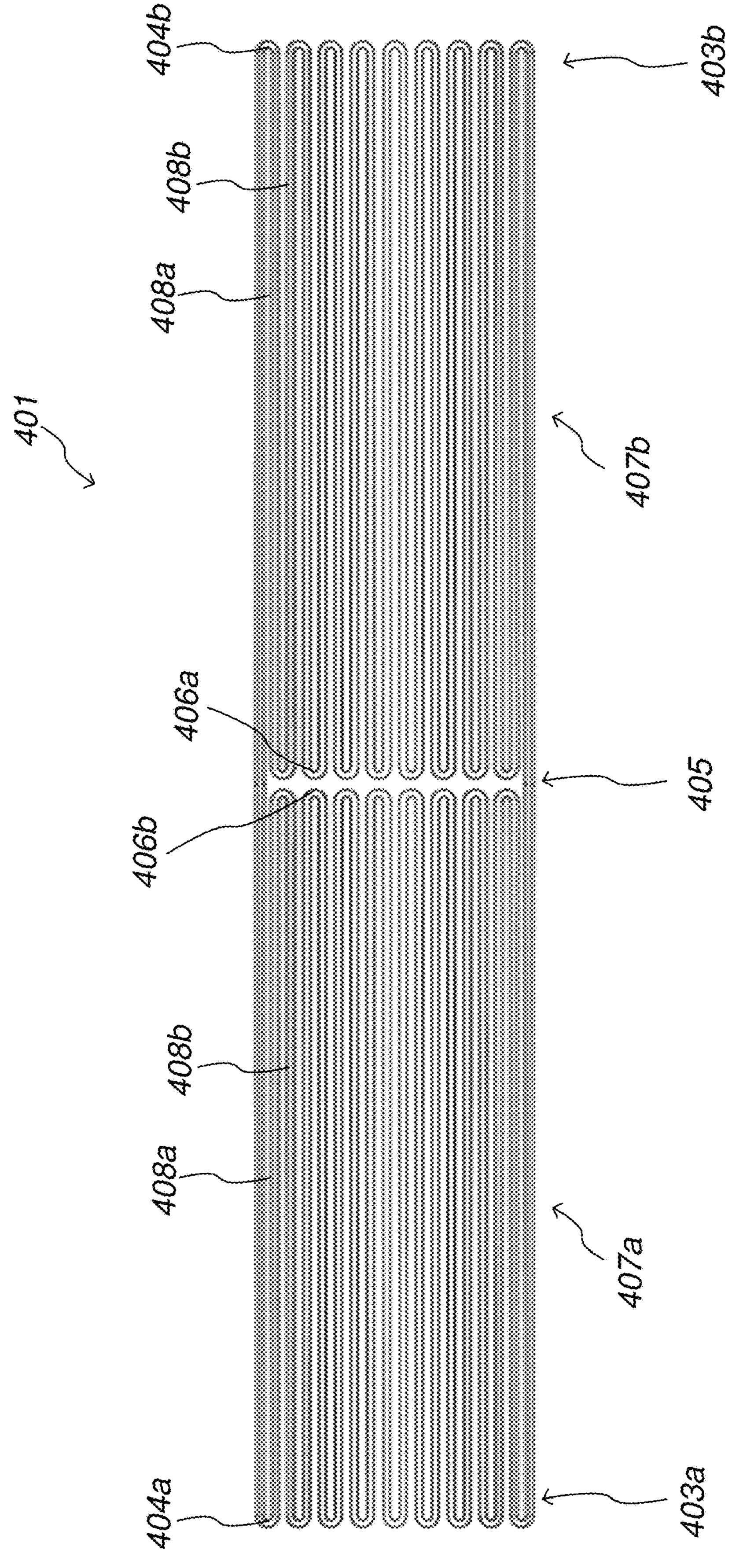
FIG. 4 is a schematic view of an oscillating heat pipe with two condenser regions in accordance with an example of the present disclosure.

FIG. 4 shows a schematic view of an oscillating heat pipe 401 similar to the oscillating heat pipe 201 described above and shown in FIG. 2, with the difference being that the oscillating heat pipe 401 can comprise two condenser regions in accordance with an example of the present disclosure. As shown, the oscillating heat pipe 401 can comprise an evaporator region 405 having a plurality of bends 406*a*, 406*b* which can absorb heat from a heat source. The heat pipe 401 in this example also comprises two condenser regions 403*a*, 403*b* each having a plurality of bends 404*a*, 404*b* which can transfer heat out of the heat pipe 401 to a heat sink.

The heat pipe 401 can further comprise a first adiabatic region 407*a* between the evaporator region 405 and the first condenser region 403*a* and a second adiabatic region 407*b* between the evaporator region 405 and the second condenser region 403*b*. Each adiabatic region 407*a*, 407*b* can comprise intermediate portions 408*a*, 408*b*. In this example, the intermediate portions 408*a*, 408*b* in each adiabatic region 407*a*, 407*b* can be similar to intermediate portions 208*a*, 208*b* described above and shown in FIG. 2 in that the intermediate portions 408*a*, 408*b* can comprise different cross-sectional areas at a given distance d from the evaporator region 405 (e.g. the first intermediate portions 408*a* can have cross-sectional areas that are larger than the second intermediate portions 408*b*). Furthermore, one or both of the intermediate portions 408*a*, 408*b* in each of the first and second adiabatic regions 407*a*, 407*b* can have a non-uniform cross sectional-area that changes (e.g., increases) from a respective condenser region 403*a*, 403*b* towards the evaporator region 405, also as described above in relation to the intermediate portions 208*a*, 208*b* shown in FIG. 2. In this manner, the heat pipe 401 with two condenser regions 403*a*, 403*b* can operate efficiently even in high gravity force environments.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An oscillating heat pipe, comprising:

a condenser region comprising a first plurality of bends;

an evaporator region comprising a second plurality of bends; and a plurality of intermediate portions extending between the first plurality of bends and the second plurality of bends, the plurality of intermediate portions comprising a first intermediate portion and a second intermediate portion, wherein a cross-sectional area of the first intermediate portion is larger than a cross-sectional area of the second intermediate portion in a plane at a first distance from the evaporator region, wherein the cross-sectional area of both of the first intermediate portion and the second intermediate portion increases continuously curvilinearly from the condenser region to the evaporator region; and wherein the plurality of intermediate portions comprises a plurality of the first intermediate portions and a plurality of the second intermediate portions, and wherein the plurality of intermediate portions alternate between the first intermediate portion and the second intermediate portion.

2. The oscillating heat pipe of claim 1, wherein the cross-sectional area of the first intermediate portion is 1.5 times to 5 times larger than the cross-sectional area of the second intermediate portion in the plane at the first distance from the evaporator region.

3. The oscillating heat pipe of claim 2, wherein the cross-sectional area of the first intermediate portion is three times larger than the cross-sectional area of the second intermediate portion in the plane at the first distance from the evaporator region.

4. The oscillating heat pipe of claim 1, wherein the cross-sectional area of both the first and second intermediate portions increases from the condenser region towards the evaporator region.

5. The oscillating heat pipe of claim 1, wherein the cross-sectional area of the at least one of the first or second intermediate portions increases by 1.5 times to 10 times from the condenser region to the evaporator region.

6. The oscillating heat pipe of claim 5, wherein the cross-sectional area of the at least one of the first or second intermediate portions increases by 4 times from the condenser region to the evaporator region.

7. The oscillating heat pipe of claim 1, wherein the plurality of intermediate portions form at least part of an adiabatic region extending between the evaporator region and the condenser region.

8. An oscillating heat pipe, comprising:

a condenser region comprising a first plurality of bends;

an evaporator region comprising a second plurality of bends; and a plurality of intermediate portions connecting the first plurality of bends to the second plurality of bends, the plurality of intermediate portions comprising first intermediate portions and second intermediate portions, wherein cross-sectional areas of the first intermediate portions are larger than cross-sectional areas of the second intermediate portions in a plane at a first distance from the evaporator region, wherein the plurality of intermediate portions in the adiabatic region alternate between the first intermediate portions and the second intermediate portions, and wherein the cross-sectional areas of both the first and second intermediate portions increase continuously curvilinearly from the condenser region to the evaporator region.

* * * * *